(12) United States Patent
Yabuta et al.

(10) Patent No.: US 7,705,334 B2
(45) Date of Patent: Apr. 27, 2010

(54) EXTREME ULTRAVIOLET RADIATION SOURCE DEVICE

(75) Inventors: Hironobu Yabuta, Shizuoka (JP); Takahiro Shirai, Shizuoka (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 169 days.

(21) Appl. No.: 11/976,526

(22) Filed: Oct. 25, 2007

(65) Prior Publication Data

US 2008/0099699 A1 May 1, 2008

(30) Foreign Application Priority Data

Oct. 26, 2006 (JP) ............... 2006-290902

(51) Int. Cl.
  *A61N 5/06* (2006.01)
  *G01J 3/10* (2006.01)
  *H05G 2/00* (2006.01)
  *G21G 5/00* (2006.01)

(52) U.S. Cl. ................. 250/504 R; 250/492.2

(58) Field of Classification Search ............. 250/504 R, 250/493.1, 492.2, 492.1, 431; 315/111.01, 315/111.21, 111.31; 378/147, 119
See application file for complete search history.

(56) References Cited

U.S. PATENT DOCUMENTS

| 6,361,824 | B1 * | 3/2002 | Yekimov et al. ............ 427/125 |
| 6,586,757 | B2 | 7/2003 | Melnychuk et al. |
| 6,984,941 | B2 | 1/2006 | Hiramoto et al. |
| 7,388,220 | B2 * | 6/2008 | Fomenkov et al. ...... 250/504 R |
| 2003/0006383 | A1 * | 1/2003 | Melnychuk et al. ..... 250/504 R |
| 2005/0098741 | A1 * | 5/2005 | Bakker et al. ............ 250/492.2 |
| 2006/0175558 | A1 * | 8/2006 | Bakker et al. ............ 250/492.2 |
| 2007/0018119 | A1 | 1/2007 | Yabuta et al. |
| 2007/0069162 | A1 * | 3/2007 | Banine et al. ........... 250/504 R |
| 2008/0001101 | A1 * | 1/2008 | Van Herpen et al. ..... 250/492.2 |

FOREIGN PATENT DOCUMENTS

| JP | 2004-501491 A | 1/2004 |
| JP | 2004-279246 A | 7/2004 |
| JP | 2007-35660 A | 2/2007 |
| WO | WO-2005/025280 A2 | 3/2005 |

* cited by examiner

*Primary Examiner*—Jack I Berman
*Assistant Examiner*—Brooke Purinton
(74) *Attorney, Agent, or Firm*—Rader, Fishman & Grauer, PLLC

(57) ABSTRACT

An extreme ultraviolet radiation source device comprises a vessel; an electric discharge section including a pair of main discharge electrodes; a material supply unit which supplies an extreme ultraviolet radiating species to the electric discharge section; a high voltage generating section which impress high voltage to the pair of main discharge electrodes; a grazing incidence type collector unit which condenses extreme ultraviolet light emitted from high temperature plasma; a light extraction section formed in the vessel; a gas supply unit which supplies gas into the vessel from a light emitting side of the collector unit, an exhaust unit which discharges the gas from a light incidence side of the collector unit; wherein a flow path through which the gas supplied from the light emitting side of the collector unit passes is formed only inside the collector unit.

16 Claims, 13 Drawing Sheets

EXTREME ULTRAVIOLET RADIATION SOURCE DEVICE

CROSS-REFERENCES TO RELATED APPLICATION

This application claims priority from Japanese Patent Application Serial No. 2006-290902 filed on Oct. 26, 2006, the contents of which are incorporated herein by reference in its entirety.

TECHNICAL FIELD

Described herein is an extreme ultraviolet radiation source device which emits extreme ultraviolet radiation, and specifically an extreme ultraviolet radiation source device equipped with the structure capable of attaining a long operation life, in which a gas flowing in an apparatus prevents debris emitted towards a light condensing unit from an extreme ultraviolet radiation generating section, from adhering to or being deposited on the light condensing unit.

BACKGROUND

Along with the miniaturization of a semiconductor integrated circuit and high integration, improvements in resolution are demanded in a projection exposure tool for manufacturing. In order to meet the demands, the wavelength of the light source for exposure is shortened, and, the extreme ultraviolet radiation source device (hereinafter referred to as an EUV (Extreme Ultra Violet) light source apparatus) which emits extreme ultraviolet radiation (hereinafter referred to as EUV light) with the wavelength in a range of 13-14 nm, especially the wavelength of 13.5 nm, has been developed as a semiconductor exposure light source for the next generation thereof, following an excimer laser device.

Although some methods of generating EUV light in such a EUV light source device are known, in one of these methods, high temperature plasma is generated to take out the EUV light emitted from this plasma by heating and exciting a substance (EUV radiating species) which emits extreme ultraviolet radiation. Such EUV light source devices are roughly divided into a LPP (Laser Produced Plasma) system and a DPP (Discharge Produced Plasma) system according to high temperature plasma generation types. The LPP EUV light source device generates high temperature plasma by laser ablation, and, on the other hand, the DPP EUV light source device generates high temperature plasma by current drive.

As types of electric discharge in the DPP EUV light source device, there are a Z pinch discharge, a capillary electric discharge, a plasma focus discharge, a hollow cathode triggered Z pinch discharge, etc. The DPP system has advantages of miniaturization of a light source apparatus and small power consumption in a light source system, so that practical application of a DPP system is also greatly expected, as compared with a LPP system.

In the EUV light source devices according to the both systems, although (around) 10-valent xenon (Xe) ion is known as the radiating species which emits EUV light with a wavelength of 13.5 nm, i.e., material of high temperature plasma, lithium (Li) ion and tin (Sn) ion are attracted attention as materials for obtaining higher radiant intensity. Among these, since the EUV conversion efficiency (=the optical output/electric input) of tin, i.e., the ratio of an EUV light output with a wavelength of 13.5 nm to an electric input required for generation of high temperature plasma, is several times as large as that of xenon, tin is regarded as a highly possible radiation species of mass-produced type EUV light source.

For example, an extreme ultraviolet radiation light source using a gas-like tin compound (for example, stannane gas: $SnH_4$ gas) is disclosed in Japanese Laid Open Patent No. 2004-279246. Moreover, an extreme ultraviolet radiation light source in which liquid-like tin is supplied to a rotating electrode is disclosed in International Publication No. WO2005/025280.

Furthermore, Japanese Laid Open Patent (Tokuhyo) No. 2004-501491 discloses a structure in which buffer gas is introduced in a light source of extreme ultraviolet radiation from a light emitting side of a collector unit, and the gas is passed through the collector unit, and exhausted from the light incidence side.

As in Japanese Laid Open Patent (Tokuhyo) No. 2004-501491, FIG. 13 shows a flow of buffer gas in an extreme ultraviolet radiation light source in which buffer gas is introduced from the light emitting side of a collector unit and exhausted from the light incidence side. In FIG. 13, when electric power is supplied between a first electrode 11 and a second electrode 12 and pulsed large current flows between the first electrode 11 and the second electrode 12, high temperature plasma P occurs by Joule heating due to the pinch effect, so that EUV light is emitted from the high temperature plasma P. The generated EUV light is emitted from an EUV light extraction section 7 through a collector unit 2 arranged in a second chamber 10b. A gas curtain nozzle 4 which is connected to a gas supply unit 16a, and a first gas exhaust unit 9a are provided in an area between an electric discharge section 1 and the collector unit 2, and a second gas supply unit 16b is provided in a light emitting side of the collector unit 2. And gas supplied from the second gas supply unit 16b is exhausted from the first gas exhaust unit 9a through the circumference thereof and the inner side of the collector unit 2.

SUMMARY

As mentioned above, although tin is regarded as a highly possible radiating species of an EUV light source, vapor pressure thereof is low and tin is solid in a room temperature. Therefore, when tin or tin compound is heated and excited so as to generate high temperature plasma, there is a problem that a lot of debris due to the tin is arising. Although an EUV light source device emits the EUV light which is emitted from the high temperature plasma generated within a light source chamber, through a collector unit arranged in the light source chamber, to the outside of the EUV light source device, when the debris resulting from tin adheres to or collides with the collector unit thereby scratching the surface of the mirror, the collector unit reflectivity of EUV light with a 13.5 nm wavelength decreases, so that the output of the EUV light which is emitted from the EUV light source device decreases.

In order to solve the problems mentioned above, a gas flow is controlled in a vessel (container) in which a light condensing unit is installed, so that the debris emitted towards the light condensing unit from an extreme ultraviolet radiation generating section may not reach the light condensing unit, or so that it is possible to remove the debris even if it adheres thereto.

The present extreme ultraviolet radiation source device comprises a vacuum vessel; an electric discharge section including a pair of main discharge electrodes; a material supply unit which supplies an extreme ultraviolet radiation species to the electric discharge section; a high voltage generating section which apply high voltage to the pair of main discharge electrodes; a grazing incidence type collector unit which corrects extreme ultraviolet light emitted from high temperature plasma; a light extraction section formed in the vessel; a gas supply unit which supplies gas into the vessel from a light emitting side of the collector unit, an exhaust unit which discharges the gas from a light incidence side of the collector unit; wherein a flow path through which the gas supplied from the light emitting side of the collector unit passes is formed only inside the collector unit.

The extreme ultraviolet radiation source device may include a foil trap provided between the electric discharge section and the collector unit, which prevents debris discharged from the electric discharge section from moving to the collector unit.

In the extreme ultraviolet radiation source device, the gas may be cleaning gas having effect of removing the debris or the gas may be mixed gas containing cleaning gas.

The following effects can be expected in the embodiments.

(1) It is possible to make debris generated in the electric discharge section, hard to reach a collector unit by forming the gas flow path to the light incidence side from the light emitting side of the collector unit. In addition, it is possible to make debris hard to adhere to, be deposited on or collide with the reflective surface by forming the gas flow in the inside of the collector unit. Therefore, the EUV reflectivity of the collector unit can be maintained.

In addition, the above-mentioned Japanese Laid Open Patent (Tokuhyo) No. 2004-501491 discloses that buffer gas is introduced from a light emitting side of a collector unit, and the gas is passed through the collector unit, and discharged from the light incidence side. However, in such a structure, the flow path through which the gas flows is also formed in the outside of the collector unit. In order that the grazing incidence type collector unit used for an EUV light source device may use efficiently the EUV light emitted from high temperature plasma, an nested structure is formed by two more mirrors in the collector unit, and the clearances of mirrors are narrow as a flow path of gas. Therefore, the conductance of the inner side of the collector unit is low. In the case of the Japanese Laid Open Patent (Tokuhyo) No. 2004-501491, most gas which is introduced from the light emitting side of the collector unit flows outside the reflection mirror with high conductance, so that such a structure may not obtain the effects that the debris generated from the electric discharge section is prevented from adhering to, being deposited on or colliding with the reflective surface of the collector unit. On the other hand, since the gas flow path is formed only inside the collector unit, all the introduced gas that is introduced from the light emitting side of the collector unit flows inside the collector unit certainly, and it is possible to prevent adhesion/deposition or deposition of debris on the reflective surface of the collector unit.

(2) Moreover, since the foil trap may be arranged so as to be in contact with the collector unit, the gas which flows through the inner side of the reflection mirror also passes the inner side of the foil trap, so that debris is prevented from adhering to or being deposited on the foil trap. Thus, it is possible to prevent a decline in the transmittance of the EUV light at the foil trap.

Moreover, the debris which adheres to, or is deposited on the collector unit can be removed due to the cleaning effect of the introduced gas, such as hydrogen, chlorine, and hydrogen chloride, or the mixed gas including this gas. Thus, even if debris adheres to or is deposited on the collector unit, the EUV reflectivity of the collector unit can be recovered by removing the debris.

BRIEF DESCRIPTION OF DRAWINGS

Other features and advantages of the present extreme ultraviolet radiation source device will be apparent from the ensuing description, taken in conjunction with the accompanying drawings, in which.

DESCRIPTION

Figure 1:
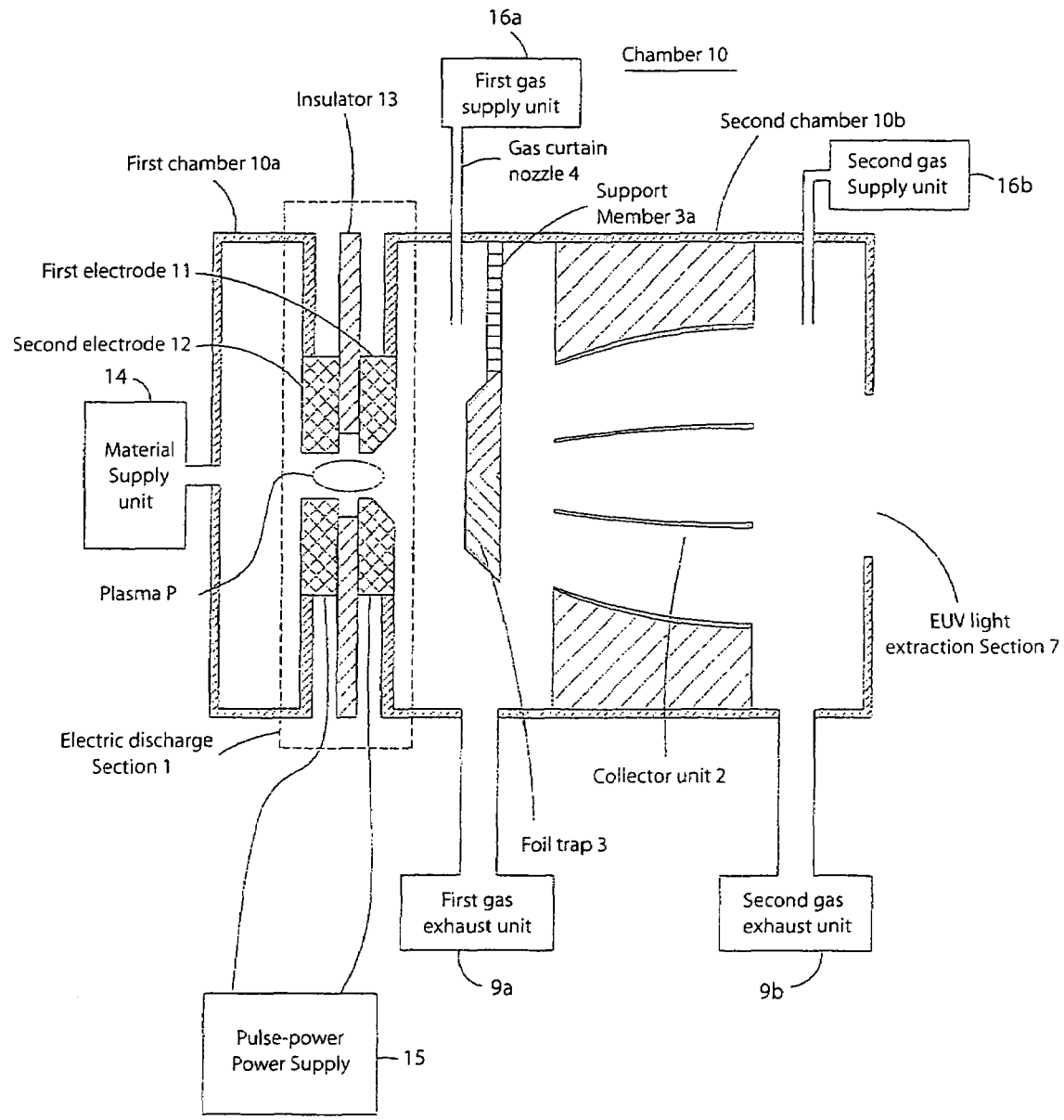
FIG. 1 is a diagram showing a schematic structure of a DPP EUV light source device according to a first embodiment of the present invention.

FIG. 1 shows a schematic structure of an example of a DPP EUV light source device according to a first embodiment. In FIG. 1, a first electrode 11 and a second electrode 12 are arranged so as to sandwich an insulator 13 therebetween in a chamber 10 which is a vacuum vessel (container). Thus, the first electrode 11, the second electrode 12, and the insulator 13 which are arranged in such a manner make up an electric discharge section 1 of the EUV light source device. The first electrode 11, the second electrode 12 and the insulator 13 have a ring-like shape, respectively, and are arranged so that the respective through-holes may be approximately located on the same axis. Here, the first electrode 11 and the second electrode 12 are electrically connected with a pulsed power supply 15 respectively, and are insulated by the insulator 13. The first electrode 11 and the second electrode 12 are made of a metal with high melting point, such as tungsten, molybdenum, and tantalum. The insulator 13 is made of ceramics with high plasma resistance, such as silicon nitride, nitriding aluminum, and boron nitride.

The chamber 10 is made up of a first chamber 10a and a second chamber 10b. When electric discharge is caused between the first electrode 11 and the second electrode 12, while supplying, to the electric discharge section 1, for example, stannane ($SnH_4$) as material for supplying tin which is an EUV radiating species, from a material supply unit 14 connected to the first chamber 10a, the material including the EUV radiating species is heated, and excited, so that plasma P occurs approximately at the center portion of the electric discharge section 1 (the center of the through-holes). In this embodiment, in order to generate high temperature plasma which emits EUV light, a pulse drive system which repeatedly performs momentary electric discharge is adopted. That is, when electric power is supplied between the first electrode 11 and the second electrode 12 from the pulsed power supply 15, creeping discharge is generated on a surface of the insulator 13, a short circuit state is virtually caused between the first electrode 11 and the second electrode 12, and pulse-like large current flows between the first electrode 11 and the second electrode 12. After that, the high temperature plasma P is produced approximately in the center (the center portion of the through-holes) of the electric discharge section 1 by Joule heating due to the pinch effect, so that EUV light is emitted from the high temperature plasma P.

The EUV light generated in the electric discharge section 1 is emitted towards an optics (not shown) provided in a side of an exposure tool, through a collector unit (mirror) 2 arranged in the second chamber 10b, from an EUV light extraction section 7. The collector unit 2 has a spheroidal shape or rotated parabola shape, and is made of metal material, such as nickel. Metal, such as ruthenium, molybdenum, and rhodium, is coated on a reflective surface of the collector unit 2 so as to efficiently reflect the EUV light and, good reflection of EUV light with a grazing angle of 25 degrees or less can be obtained by the collector unit 2.

As above-mentioned, the EUV light is emitted by the high temperature plasma generated in the electric discharge section 1. However, at the same time, debris is also discharged from the electric discharge section 1, thereby dispersing in the chamber 10. The term "debris" used here means, material of the electrodes 11, 12 and/or the insulator 13 in the electric discharge section 1 which is eroded by the high temperature plasma, material decomposed by contributing to electric discharge, material discharged without contributing to the electric discharge, and/or reaction products thereof. When such debris reaches the collector unit 2 so as to adhere to, be deposited on, or corrodes by collision, the reflective surface of the collector unit 2, thereby sometimes reducing the EUV light reflectivity of the collector unit 2. When the EUV light reflectivity of the collector unit goes down, an EUV light outputted from the EUV light source device goes down. Therefore, a gas curtain nozzle 4 connected to a gas supply unit 16a is arranged so as to supply mixed gas containing at least one of hydrogen, helium, argon, krypton, and nitrogen to an area between the electric discharge section 1 and the collector unit 2. The gas from the first gas supply unit 16a is supplied so that the gas flow from the gas curtain nozzle 4, meets debris and exhausted by a first gas exhaust unit 9a. Thus, the gas curtain formed in such a manner decelerates the speed of the debris which is discharged from the electric discharge section 1 and which disperses toward the collector unit 2, by locally forming a high pressure gas portion, thereby preventing the debris from reaching the collector unit 2.

Furthermore, a foil trap 3 is arranged in the area between the gas curtain nozzle 4 and the collector unit 2. In this embodiment, the foil trap 3 is attached to the chamber 10 by a foil trap support member 3a so that the foil trap 3 is apart from the collector unit 2. The foil trap 3 comprises two rings (an internal ring, and an external ring) which are arranged concentrically, and a plurality of thin plates which are supported at both sides thereof by these two rings, and which are arranged radially. The plates divides the assigned space finely, thereby the pressure of the space is raised and the kinetic energy of debris is reduced. Many pieces of debris whose kinetic energy has been reduced are caught by the plate and rings of the foil trap. When the foil trap is viewed from the side of high temperature plasma, only the thickness of the plates can be viewed, except for the two rings, so that most EUV light can pass therethrough. The plates of the foil trap 3 are made of high melting point metal, such as tungsten and molybdenum.

However, it is difficult to eliminate all debris by the gas curtain and the foil trap 3 in fact, and there are still some of debris which reach the collector unit 2. A second gas supply unit 16b and a second gas exhaust unit 9b are therefore arranged, for example, in a light emitting side of the collector unit 2 in order that the gas may flow from the light emitting side of the collector unit 2 toward a light incidence side thereof, so that the gas flows against the debris which flows toward the collector unit 2 from the electric discharge section 1. And the gas flow rate of the second gas supply unit 16b and the gas exhaust speed of the second gas exhaust unit 9b may be adjusted. Part of the gas supplied from the second gas supply unit 16b is exhausted by the second gas exhaust unit 9b, and the remaining gas is exhausted from the first gas exhaust unit 9a through an inner side of the collector unit 2. In addition, the second gas exhaust unit 9b is not indispensable, and the gas flow which passes through the collector unit 2 can be formed by only the first gas exhaust unit 9a.

The gas supplied from the second gas supply unit 16b, is selected suitably from gas which does not include an extreme ultraviolet radiating species, i.e., gas which does not adhere to or is not deposited on the reflective surface of the collector unit 2. For such gas, hydrogen, helium, argon, krypton, nitrogen etc. which is used for the gas curtain may be used.

Furthermore, the grazing incidence type collector unit 2 used for the EUV light source device, has an nested structure of two or more mirrors, in order to efficiently use the EUV light emitted from high temperature plasma, so that the intervals of the mirrors are narrow as a gas flow path. Therefore, in the prior art, the conductance of the inner side of the collector mirror 2 is low. Most gas flows outside the reflective mirror which has a high conductance, i.e., between the outermost reflective surface of the collector mirror 2 and inner walls of the chamber 10, when the gas is just introduced from the light emitting side of the collector. Then the effect to prevent the debris from adhering to, depositing on or colliding with the reflective surface of the collector mirror 2 can hardly be expected.

Therefore, in order to prevent the debris from adhering to, being deposited on or colliding with the reflective surface of the collector unit, it is necessary to form a gas flow path only inside the collector unit. In FIG. 1, a portion of the inner wall of the vessel (chamber 10) is protruded toward the inside thereof. The EUV light reflective surface is formed on the protruded inner wall so as to form the outermost reflective mirror of the collector mirror.

Figure 2:
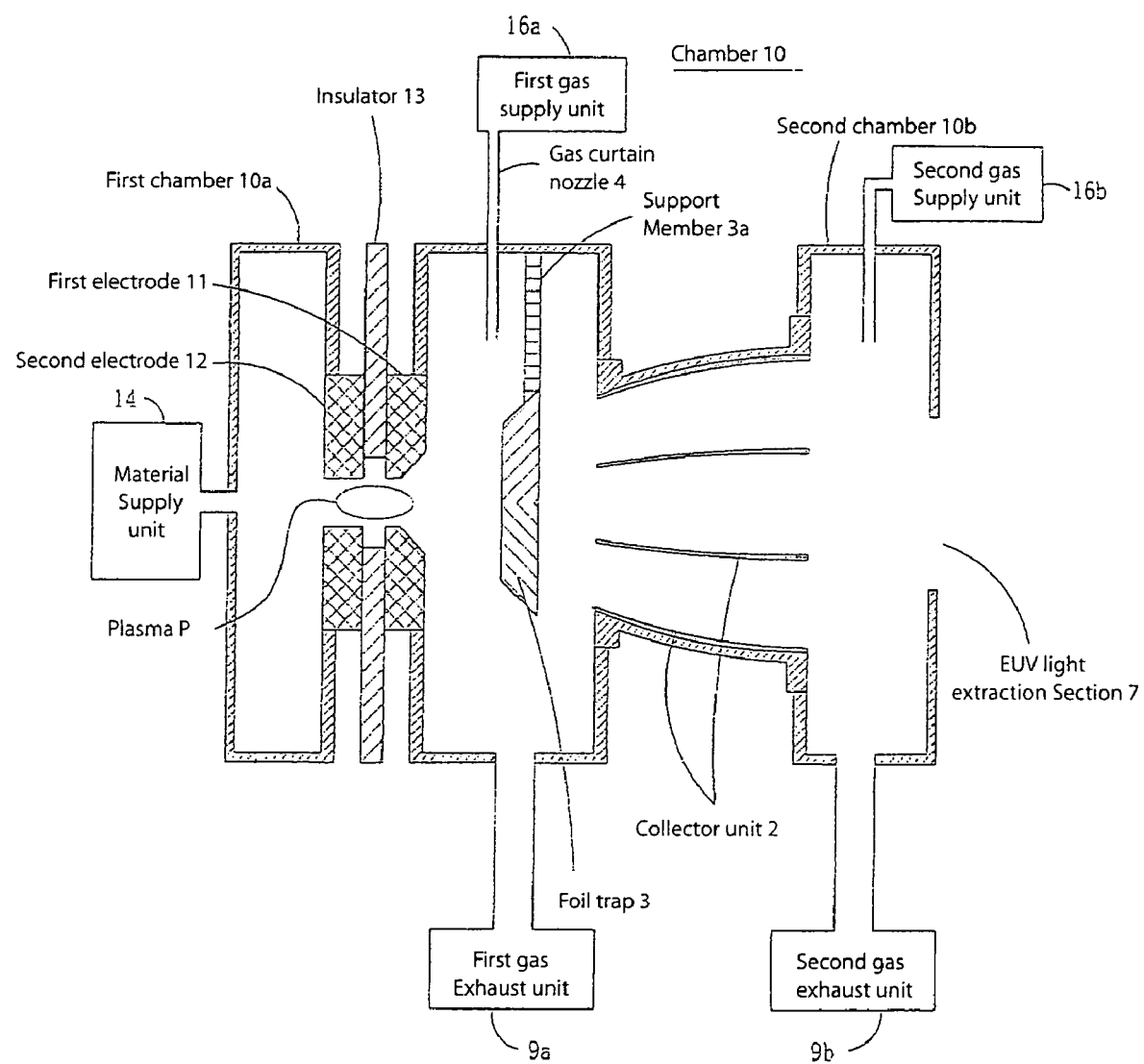
FIG. 2 is a diagram showing a first modified example of the first embodiment.
Figure 3:
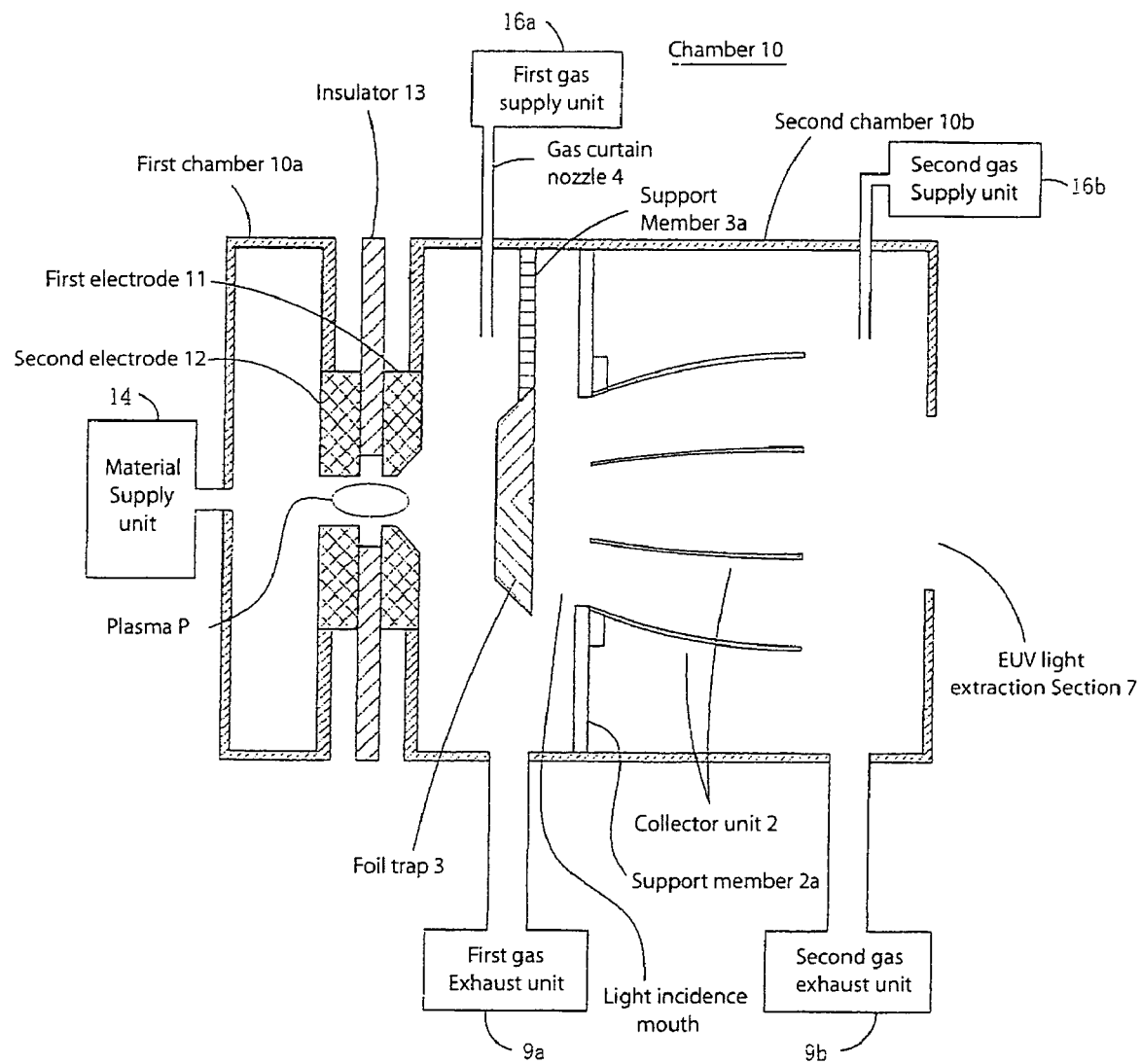
FIG. 3 is a diagram showing a second modified example of the first embodiment.
Figure 4:
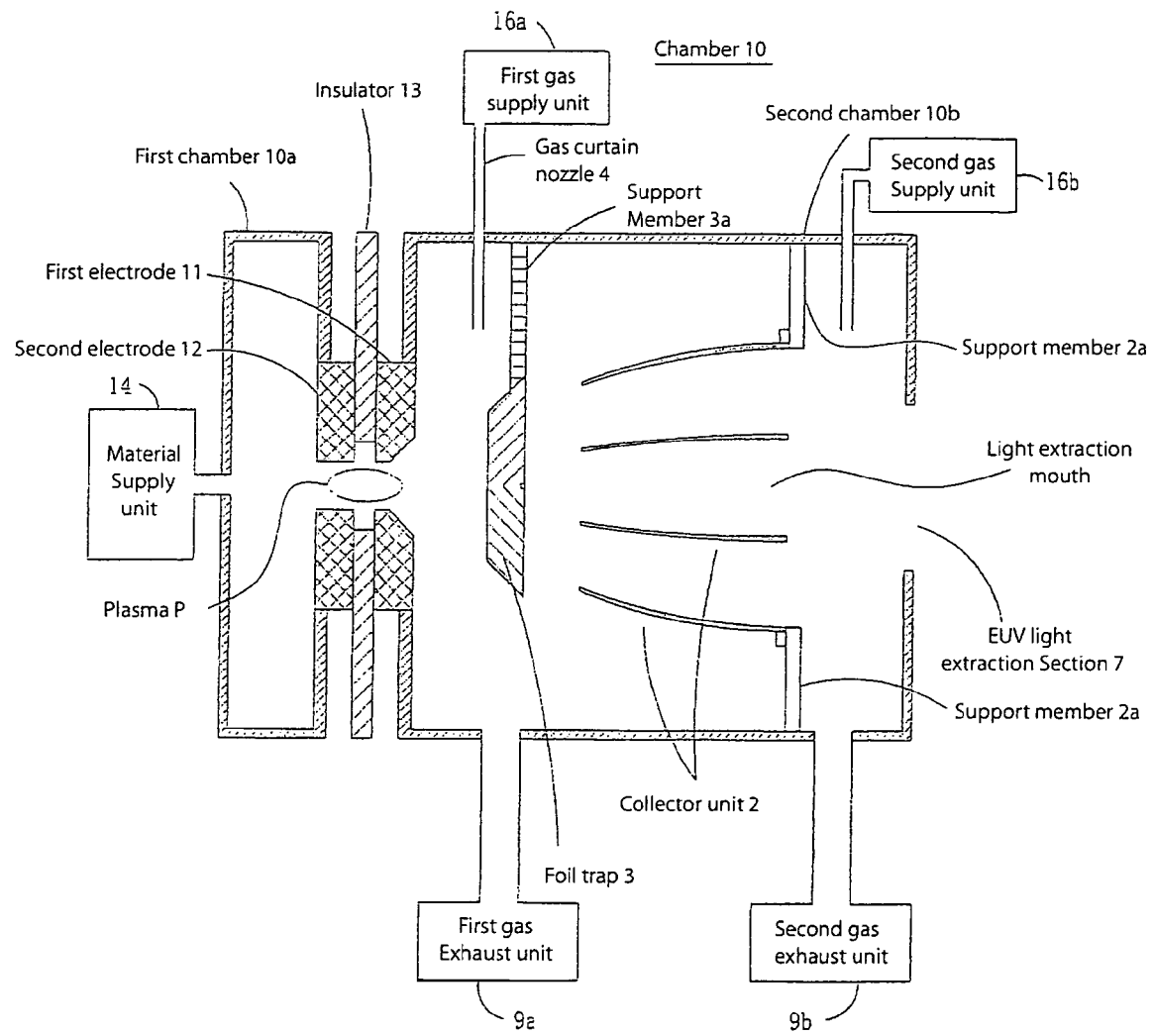
FIG. 4 is a diagram showing a third modified example of the first embodiment.

FIGS. 2 to 4 show embodiments of a structure which forms such a gas flow path only inside the collector unit. If in the structure, all gaseous flux passes through the space surrounded by the collector unit 2, it is possible to form a gas flow which can prevent dispersal of debris to the reflective surface of the collector unit.

FIG. 2 shows a modified embodiment of FIG. 1, in which the inner wall(s) of the chamber 10 are projected inwardly and the outermost reflective surface of the collector unit 2 is formed thereon. That is, the chamber 10 is deformed.

FIG. 3 shows another modified embodiment of FIG. 1, in which a support member 2a for supporting the collector unit 2 is provided in the light incidence side of the collector unit 2, so as to form a wall-like partition. That is, the support member 2a does not have an opening, except for a light incidence mouth portion of the collector unit 2. Therefore, the gas introduced from the light emitting side of the collector unit 2 cannot flow the outside (between the outermost reflective mirror of the collector unit, and the inner walls of the vessel) of the collector unit.

FIG. 4 shows still another modified example of the embodiment of FIG. 1, in which a support member 2a of the collector unit 2 is provided in the light emitting side of the collector unit 2, on the contrary to that of FIG. 3, so as to form a wall-like partition. The support member 2a does not have an opening, except for the light emitting mouth portion of the collector unit 2. Since, in such a structure, the debris discharged from the electric discharge section 1 is put back from the side of the collector unit 2 by the gas flow formed as mentioned above, so that debris is exhausted from the first gas exhaust unit 9a out of a chamber 10, it is possible to reduce the debris which adheres to, is deposited on or collides with the collector unit 2.

Furthermore, in order to remove debris which adheres to, is deposited on the reflective surface of the collector unit 2, it is also possible to supply cleaning gas from the second gas supply unit 16b. Hydrogen, chlorine, hydrogen chloride, etc. and mixed gas containing these gas may be used as the cleaning gas. For example, since hydrogen binds to tin etc., becoming gas, such as a stannane, thereby removing the adhered tin, it is possible to use the hydrogen as the cleaning gas, when using tin as an EUV radiating species. Thus, the cleaning gas is also transported into the collector unit 2 with the gas flow formed in the collector unit 2, so that the debris adhering to the collector unit 2 can be removed. In addition, the gas supply unit which supplies the cleaning gas may be provided separately from the second gas supply unit 16b, so as to supply it into the chamber 10.

Figure 5:
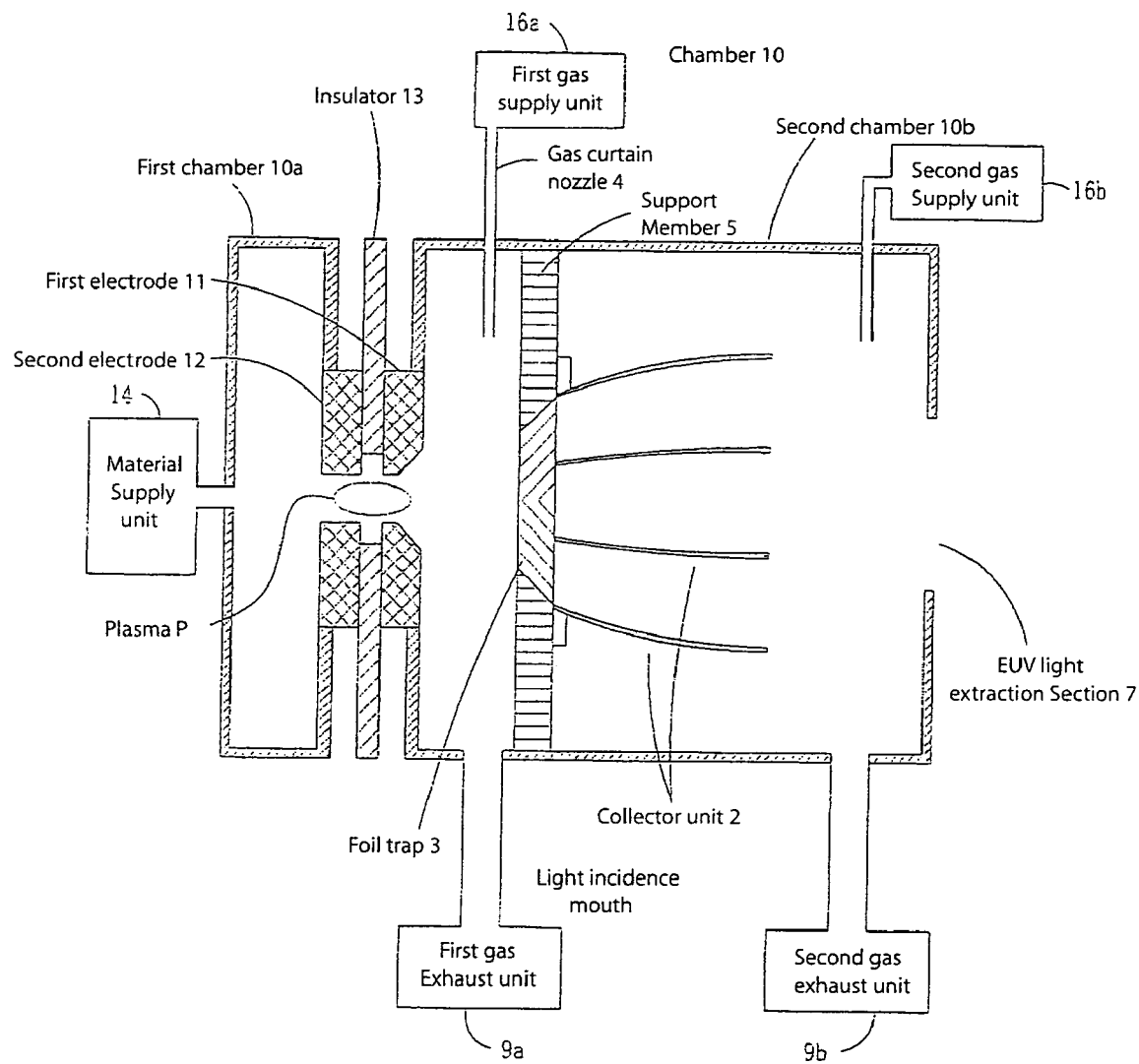
FIG. 5 is a diagram showing a schematic view of the structure of a DPP EUV light source device according to a second embodiment.
Figure 6:
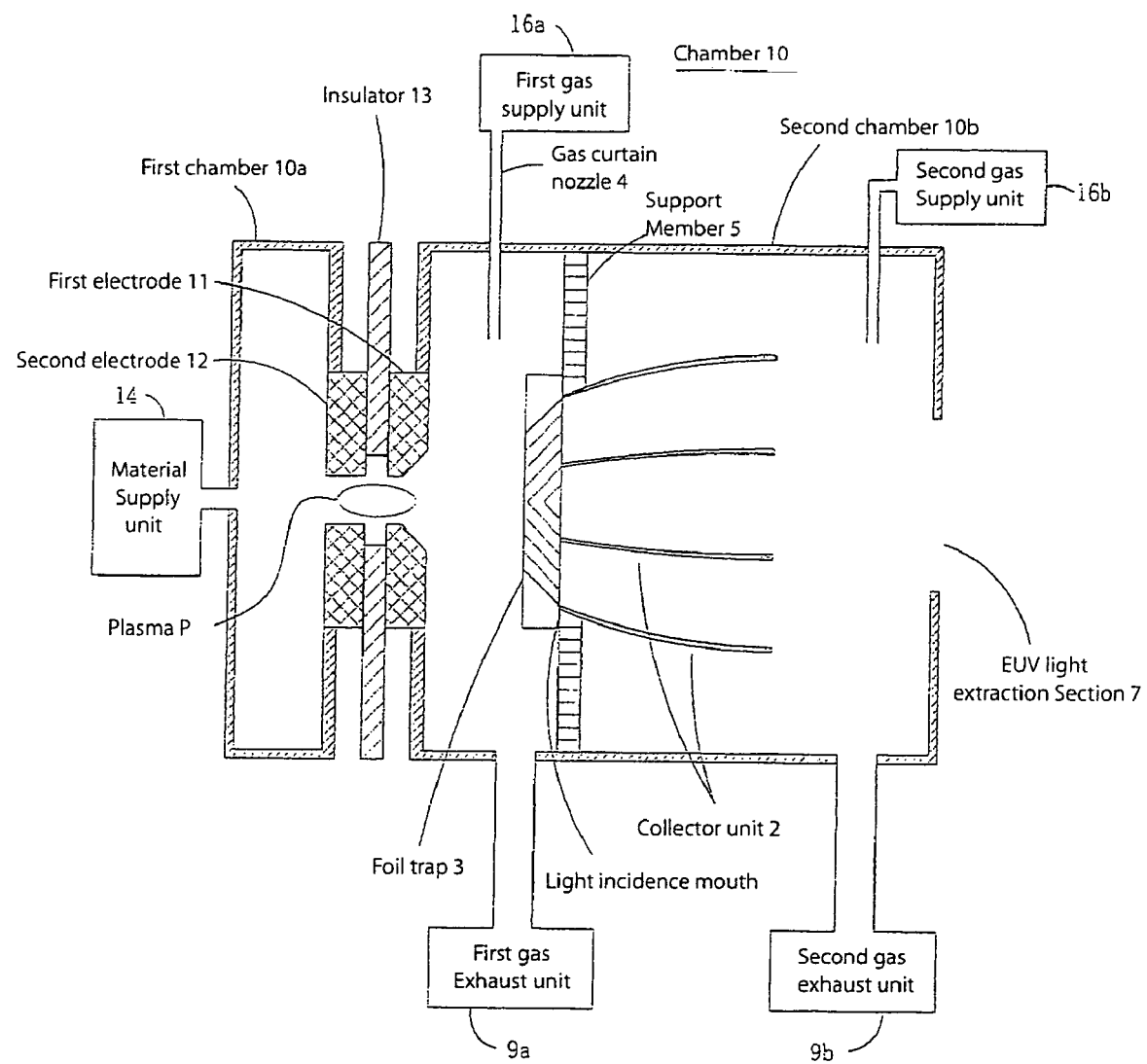
FIG. 6 is a diagram showing a modified example of the second embodiment.

FIG. 5 shows a schematic structure of a second embodiment of a DPP EUV light source device, and FIG. 6 shows a modified embodiment thereof, in which the foil trap 3 of FIG. 3 is arranged in contact with the collector unit 2, and the other structural elements are the same as those shown in FIG. 3.

In this embodiment, a support member 5 disposed in the light incidence side of the collector unit 2 supports the foil trap 3 and the collector unit 2, that is, the support member 5 serves as a support for the collector unit 2 and the foil trap 5, and they are formed as a unit (are integrated). While FIG. 5 is the diagram in which the collector unit 2 is supported by the support member of the foil trap 3, FIG. 6 is a diagram in which the foil trap 3 is supported by a support member of the collector unit 2. As shown in FIGS. 5 and 6, the foil trap 3 and the collector unit 2 are integrated and supported by the support member 5, and in order to form a gas flow path only inside the collector unit 2, and an opening is formed only in a portion of the light incidence mouth of the foil trap 3, among the collector unit 2, the foil trap 3 and the support member 5.

Since the foil trap 3 is arranged in contact with the collector unit 2, there is no gap therebetween so that the gas introduced from the light emitting side of the collector unit 2 can be certainly passed only inside the collector unit 2. Therefore, the introduced gas passes through only the inner side of the foil trap 3, so that debris can be prevented from adhering to or being deposited on the foil trap 3. Thereby, the adhesion sediment to the foil trap 3 does not interrupt the EUV light which passes through the foil trap 3.

In addition, after the foil trap 3 and the collector unit 2 are beforehand attached to the support member 5 outside the chamber 10 so as to integrate them, the above-mentioned collector unit 2 and foil trap 3 are attached to the vessel (chamber and the unit in which the foil trap 3 and the collector unit 2 are integrated is inserted into the chamber 10, and the support member 5 is fixed to the inner wall(s) of the chamber 10.) After fixing the unit to the vessel (chamber) 10, the position of the condensing point of EUV light emitted from the collector unit 2 is adjusted to a desired position.

Although in the above-mentioned embodiments, the gas introducing port of the second gas supply unit 16b is provided in the chamber 10, and the gas is introduced in the vessel from this introducing port, in order that the gas flows uniformly inside of the collector unit, two or more gas introducing ports (gas nozzle) of the above-mentioned gas supply unit 16b are arranged so that EUV light may not be blocked in the light emitting side of the collector unit 2, thereby discharging the gas towards the opening of the collector unit 2.

Figure 7:
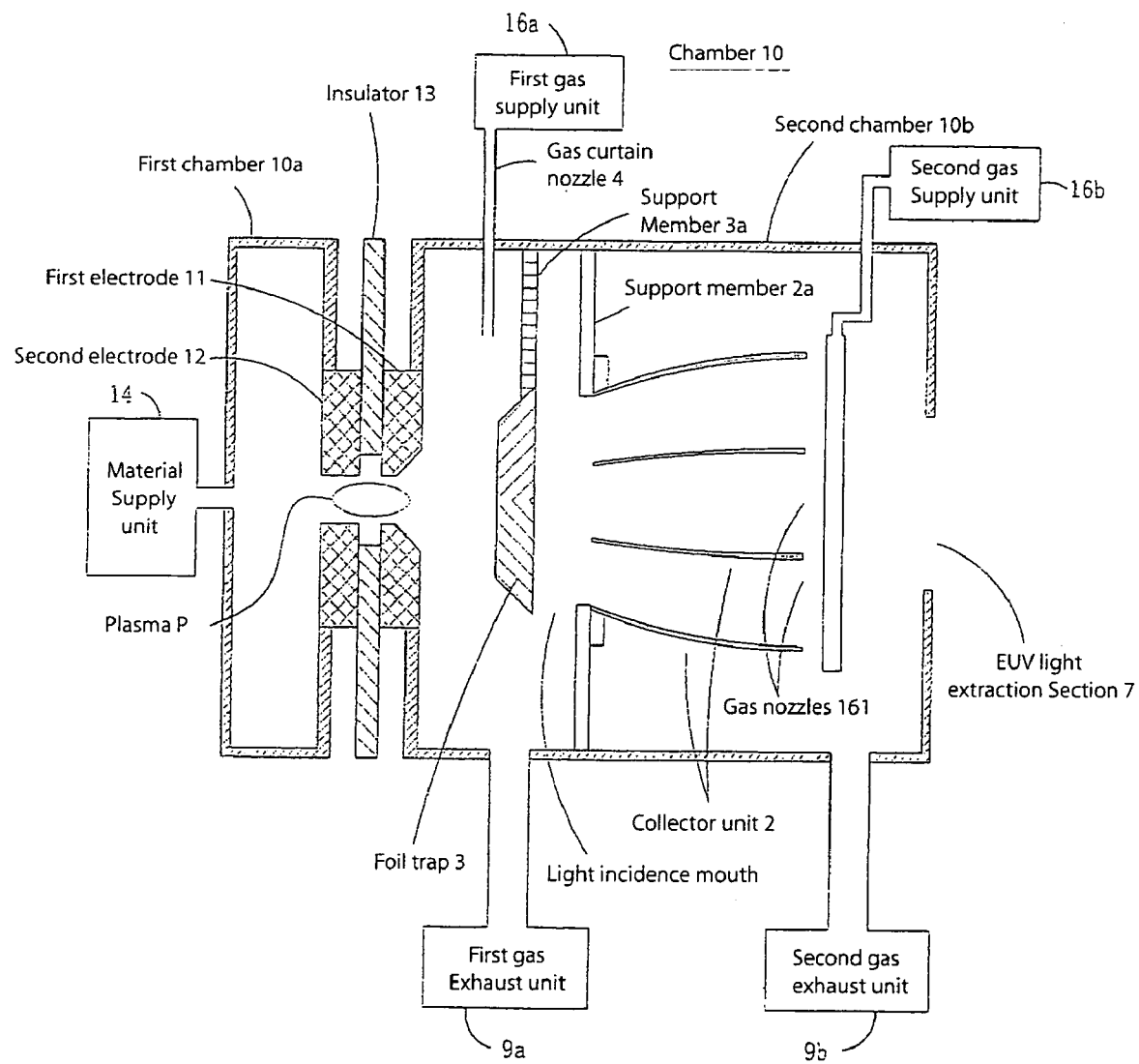
FIG. 7 is a diagram showing an example of arrangement of gas introducing ports (gas nozzles) of a second gas supply unit.

As shown in FIG. 7, gas nozzles 161 of the second gas supply unit 16b are provided in the light emitting side of the collector unit 2, so that gas is introduced inside the collector unit 2. Therefore, the gas can be more effectively introduced inside the collector unit 2.

Figure 8:
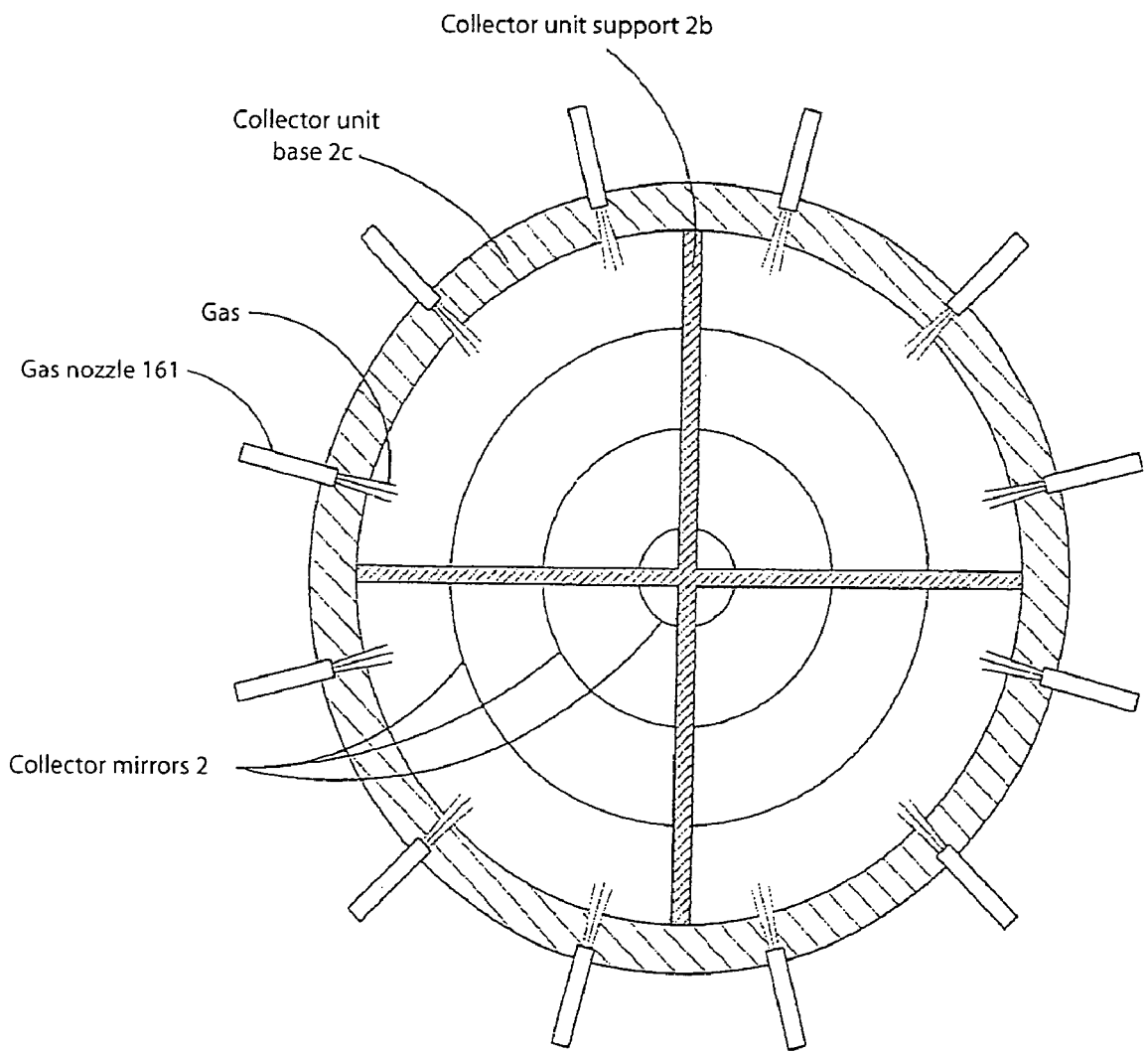
FIG. 8 is a diagram showing a case where gas nozzles have been arranged at equal intervals around an opening of a light emitting side of a collector unit.
Figure 9:
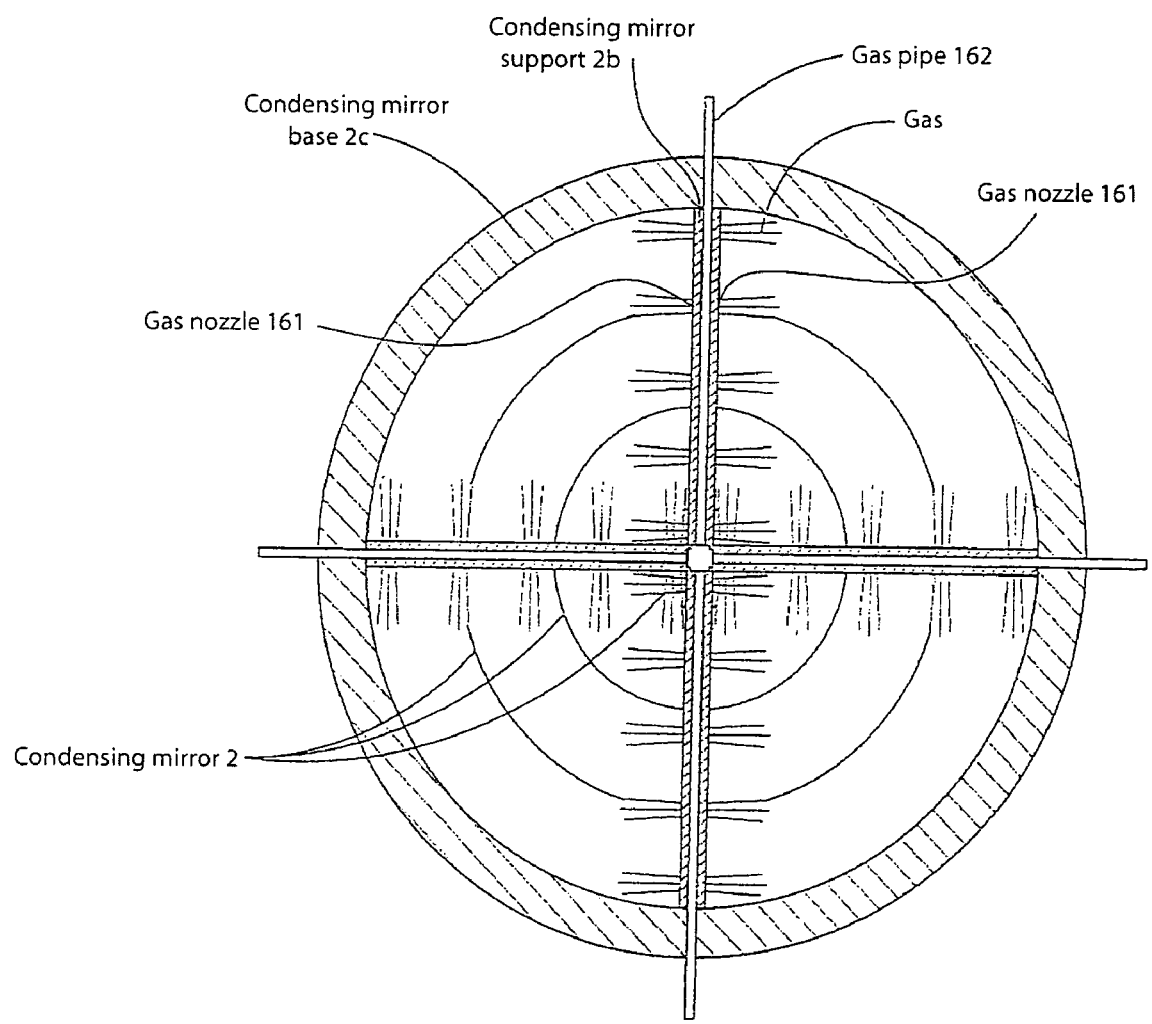
FIG. 9 is a diagram showing a case where gas pipes are provided, and two or more gas nozzles for emitting gas are provided along a support member of a collector unit.
Figure 10:
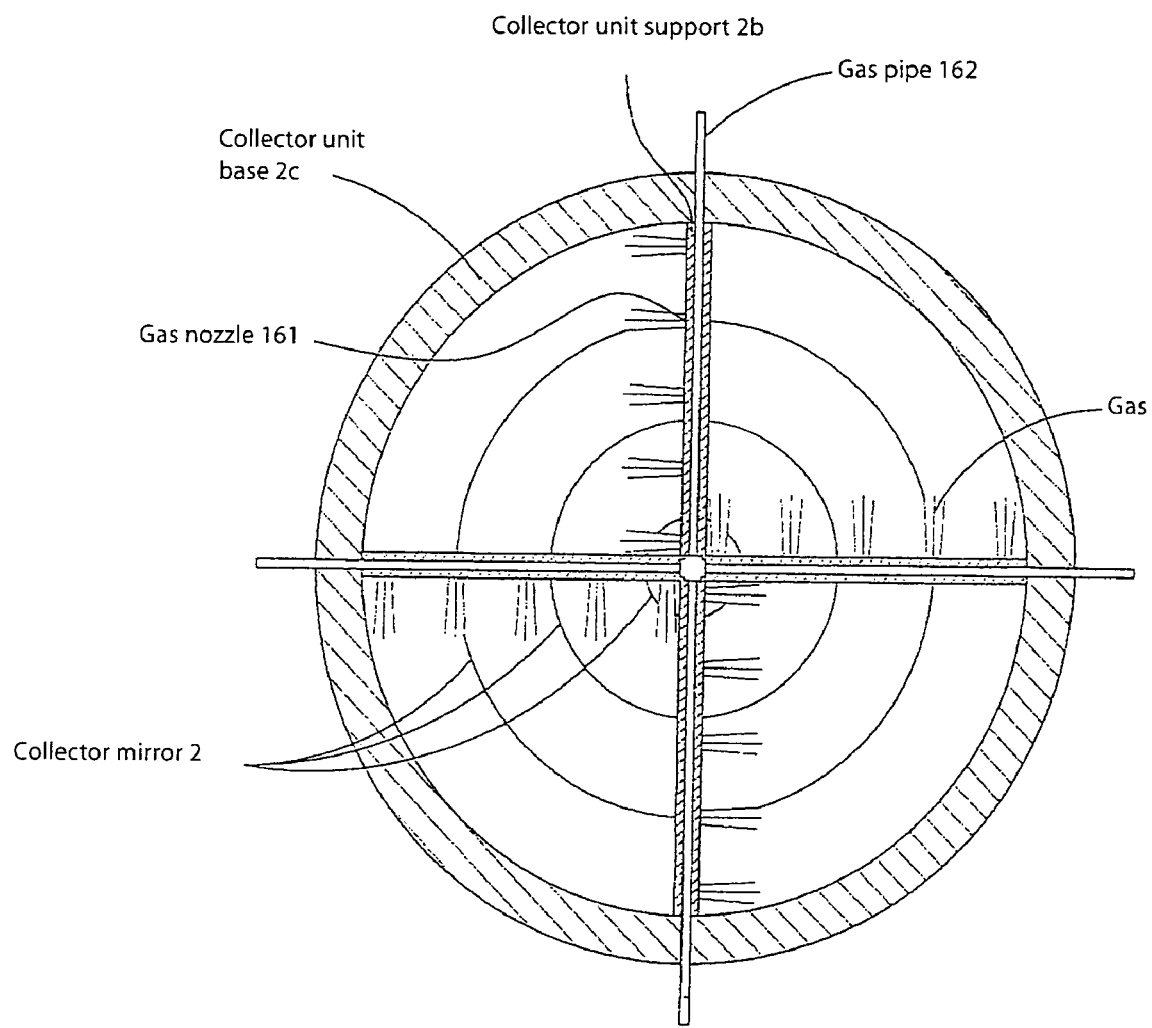
FIG. 10 is a diagram showing a case where gas pipes are provided, and two or more gas nozzles for emitting gas are provided along a support member of a collector unit.

FIGS. 8, 9, and 10 show examples of an arrangement of the nozzles 161 in the case of introducing gas from the light emitting side of the collector unit 2. All the figures show views seen from the light emitting side of the collector unit 2.

In FIG. 8, the nozzles 161 of the second gas supply unit 16b are arranged at equal intervals in a circumference portion surrounding the opening of the light emitting side of the collector unit 2, so that gas is discharged towards the opening of the collector unit 2. In addition, a support member 2b supports the collector unit 2 to a base 2c of the collector unit 2.

FIGS. 9 and 10 show examples in which gas pipes 162 are provided along supports 2b for supporting the collector unit 2, and two or more gas nozzles 161 for emitting gas from gas pipes 162 are provided. While FIG. 9 shows an example of the gas pipes in which gas is emitted from both sides of each gas pipe 162, FIG. 10 shows an example of the gas pipes in which gas is emitted from one side of each gas pipe 162.

As shown in FIGS. 8 to 10, it is desirable to provide two or more gas nozzles (gas introducing ports) 161, at equal intervals near the light emitting side of the collector unit 2 so that the gas may uniformly flow the inside of the collector unit 2.

Moreover, in order to supply the gas to the center portion of the collector unit 2, as shown in FIGS. 9 and 10, the thin pipes are used so as not to block light, and gas introducing ports may be provided so as to cross the light emitting mouth of the collector unit 2. Since, in this case, the supports 2b for supporting two or more mirrors which make up the collector unit 2 are attached to the collector unit 2, if the gas nozzles 161 are provided along the supports 2b, the intensity of EUV light which is blocked thereby can be reduced. Moreover, since debris tends to exist much more in the center portion near the optical axis, the number of the gas nozzles 161 may be increased as it is close to the center of the collector unit 2.

Moreover, the diameter of pipes (gas pipes 162) which introduce gas may be thick as they are close to the tip thereof, in consideration of the conductance in piping.

Moreover, although the gas nozzles 161 which emit gas may be ones which are made from a pipe(s) by merely cutting it so that the shape thereof is tubular, they may be ones which are made from processed rubber nozzles like supersonic nozzles in order to control the flow of gas.

In addition, although the EUV light source device which supplies an EUV light emission species as gas is explained above as an example, the above embodiments can be applied to an EUV light source device which supplies a liquid EUV light emission species to rotating electrodes.

Figure 11:
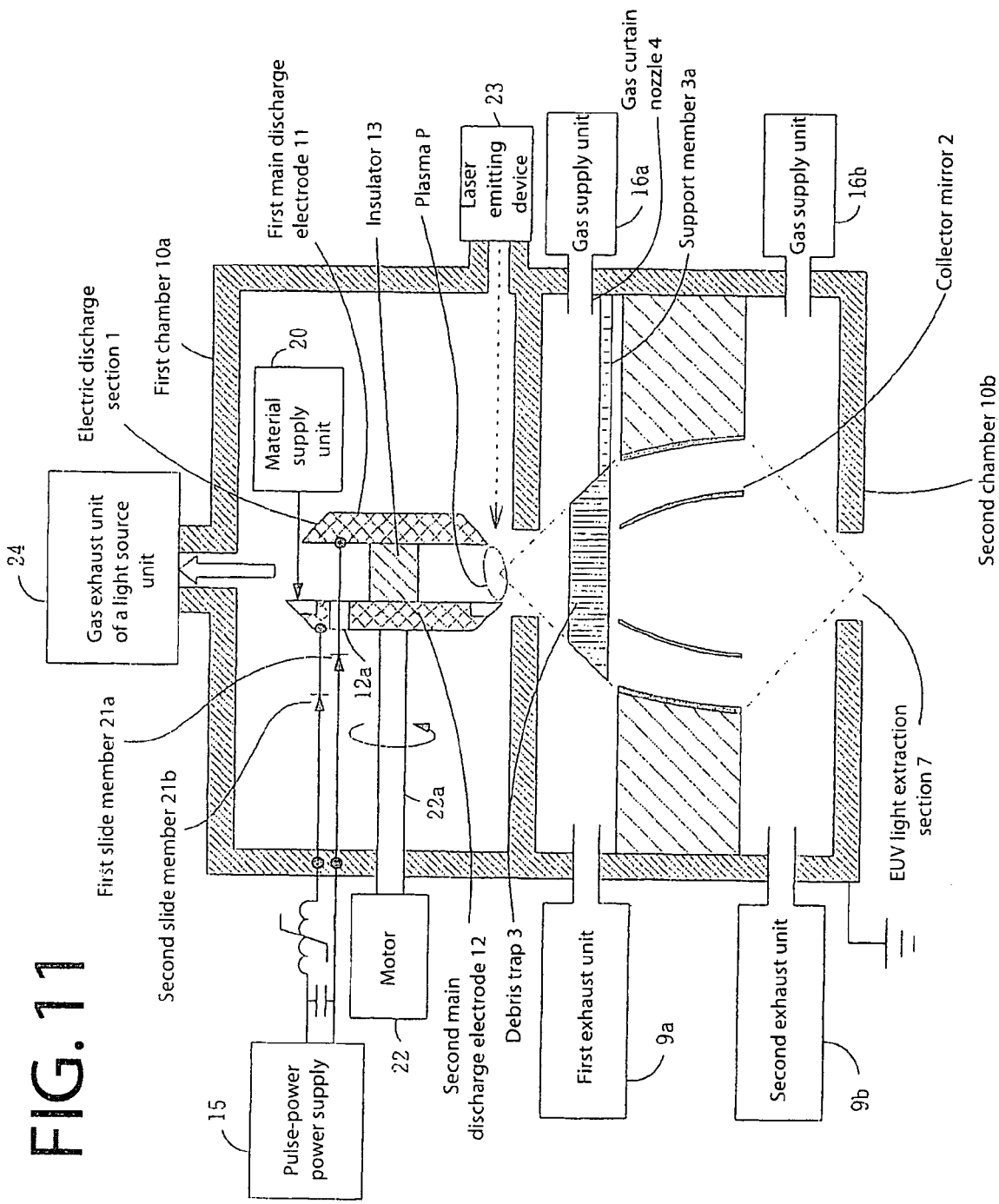
FIG. 11 is a diagram showing the structure of an EUV light source device according to a third embodiment.

FIG. 11 shows the structure of a third embodiment of the EUV light source device according to the present invention, using the rotating electrodes. The structure of the EUV light source device shown in the figure is basically the same as that shown in FIG. 1, such as the foil trap and the collector unit, but only the structure of the electric discharge section in FIG. 11 differs from that shown in FIG. 1. Therefore, the structure of the electric discharge section is mainly explained.

Figure 12:
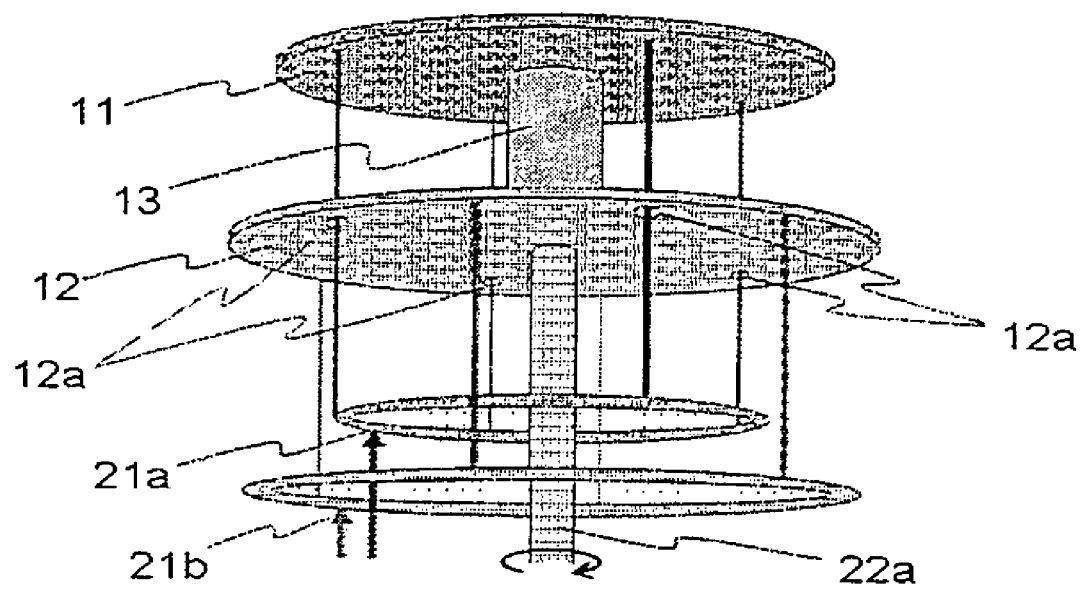
FIG. 12 shows an enlarged schematic view of an electric discharge section.
Figure 13:
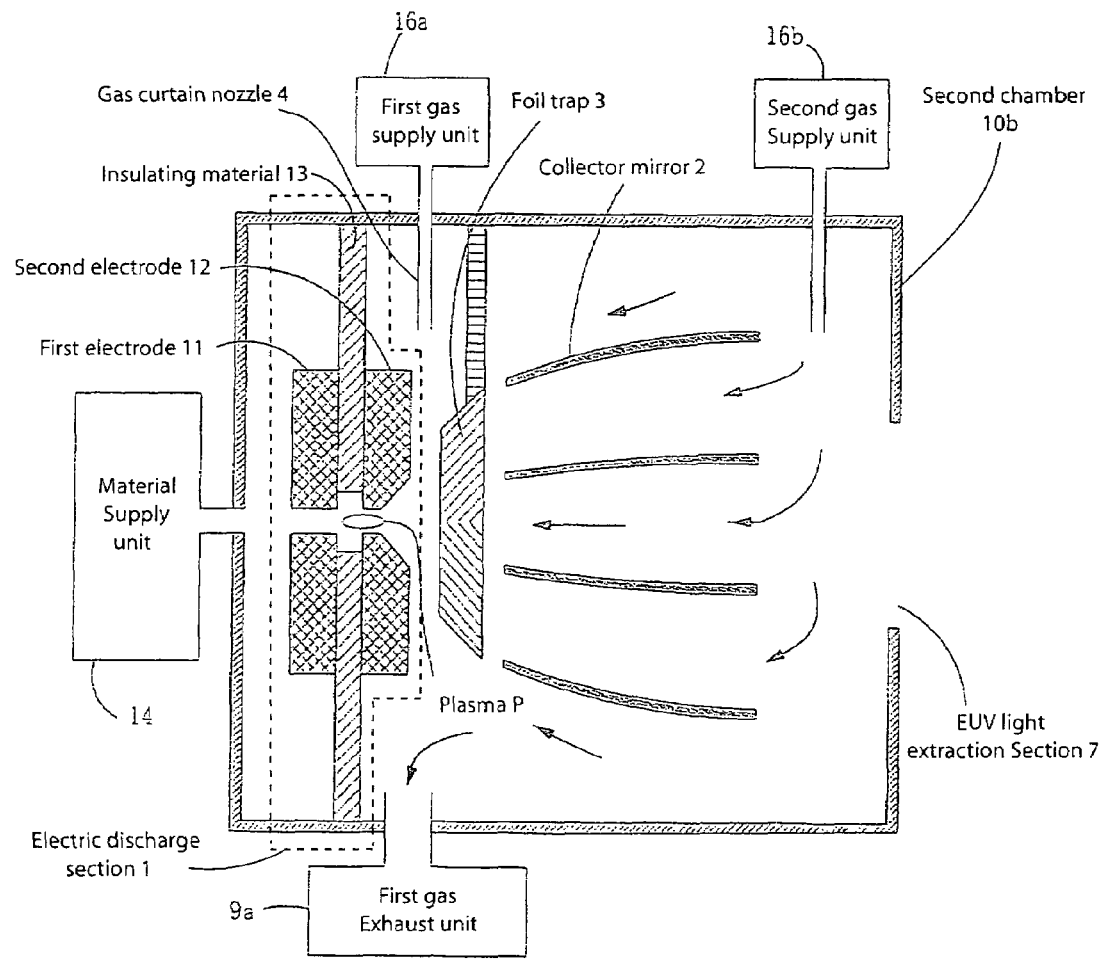
FIG. 13 shows a flow of buffer gas in a conventional extreme ultraviolet radiation light source.

FIG. 12 shows a schematic view of an electric discharge section according to the present embodiment. The electric discharge section 1 which is arranged in a first chamber 10a comprises a first main discharge electrode 11 which is a metal disk-like component, a second main discharge electrode 12 which is also a metal disk-like component, and an insulator 13 which is sandwiched by the first main discharge electrode and the second discharge electrode. The first main discharge electrode and the second main discharge electrode are disposed in parallel to each other. The center of the first discharge electrode 11 and the center of the second discharge electrode 12 are arranged approximately on the same axis, and the first discharge electrode 11 and the second discharge electrode 12 are fixed to a position at which they are apart from each other, by the thickness of the insulating material 13. Here, the diameter of the second discharge electrode 12 is larger than that of the first discharge electrode 11. Moreover, the thickness of the insulating material 13, i.e., the clearance of the first discharge electrode 11 and the second discharge electrode 12, is approximately 1 mm-10 mm. A rotation shaft 22a of a motor 22 is attached to the second discharge electrode 12. In this embodiment, the rotation shaft 22a is disposed approximately at the center of the second discharge electrode 12, so that the center of the first discharge electrode 11 and the center of the second discharge electrode 12 are located approximately on the same axis of a rotational axis member. Moreover, a light source gas exhaust unit 24 is connected in a first chamber 10a, and the inside of first chamber 10a is maintained at reduced pressure atmosphere.

The rotation shaft 22a is installed in the first chamber 10a through a mechanical seal (not shown). The mechanical seal allows rotation of the rotation shaft 22a, maintaining the reduced pressure atmosphere in the first chamber 10a. A first slide member 21a and a second slide member 21b which are made from carbon brushes etc. are provided in one side of the second discharge electrode 12. The second slide member 21b is electrically connected with the second discharge electrode 12. On the other hand, the first slide member 21a is electrically connected with the first discharge electrode 11 through a through-hole 12a which penetrates the second electric discharge electrode 12. In addition, by insulating mechanism, dielectric breakdown may not occur between the second discharge electrodes 12 and the first slide member 21a which is electrically connected with the first discharge electrode 11. The first slide member 21a and the second slide member 21b are electric contacts which maintain electric connection, while sliding, between the electrodes and a pulsed power supply 15 which is a high-voltage generating section. The pulsed power supply 15 supplies pulse-like electric power through the first slide member 21a and the second slide member 21b between the first discharge electrode 11 and the second discharge electrode 12. That is, even if the motor 22 is operated so that the first discharge electrode 11 and the second discharge electrode 12 are rotated, the pulse-like electric power is impressed from the pulsed power supply 15 through the first slide member 21a and the second slide member 21b between the first discharge electrode 11 and the second discharge electrode 12.

The pulsed power supply 15 impresses pulse electric power with a short pulse width between the first discharge electrodes 11 and the second discharge electrodes 12 which are load, through a magnetic pulse compression circuit section comprising a capacitor and a magnetic switch. In addition, the first slide member 21a and the second slide member 21b are wired through an insulating current introduction terminal (not shown) from the pulsed power supply 15, respectively. The current introduction terminal is attached to the first chamber 10a, and while maintaining the reduced pressure atmosphere in first chamber 10a, the electric connection of the first slide member 21a and the second slide member 21b with the pulsed power supply 15 is maintained. The circumference sections of the first discharge electrode 11 and the second discharge electrode 12, each of which is a metal disk-like component, are formed in an edge shape. When electric power is impressed to the first discharge electrode 11 and the second discharge electrode 12 from the pulsed power supply 15, electric discharge occurs between the edge shape portions of both electrodes. Since these electrodes become high in temperature due to plasma generated by electric discharge, the first main discharge electrode 11 and the second main discharge electrode 12 are made of high melting point metal, such as tungsten, molybdenum, and tantalum. Moreover, the insulator 13 is made of silicon nitride, nitriding aluminum, and diamond, etc. A groove portion is provided in the circumference section of the second discharge electrode 12, and solid Sn or solid Li which is an EUV light generating species is supplied to this groove portion. The EUV light generating species is supplied from a material supply unit 20.

The material supply unit 20 liquefies the Sn or Li (raw material) which is an EUV light generating species, by heating, so as to supply it to the groove portion of the second discharge electrode 12. Or the material supply unit 20 may be formed so that solid Sn and solid Li may be periodically supplied to the groove portion of the second discharge electrode 12. The rotation shaft 22a rotates so that the motor 22 rotates only in one direction, by an operation of the motor 22, and then the second discharge electrode 12 and the first discharge electrode 11 which are attached to the rotation shaft 22a rotate in the one direction. The Sn or Li placed in or supplied to the groove portion of the second discharge electrode 12 moves by the rotation. On the other hand, a laser emitting device 23 which irradiates laser light to the Sn or Li which has moved to the side of the EUV collector section, is provided in first chamber 10a. The laser light from the laser emitting device 23 is condensed, and is irradiated on the Sn or Li which has moved to the EUV condensing section side, through a laser light transmission window (not shown) which is provided in first chamber 10a and a laser light condensing unit. As described above, the diameter of the second discharge electrode 12 is larger than the diameter of the first discharge electrode 11. Therefore, alignment of the laser light can be easily carried out so that the laser light passes along the side of the first discharge electrode 11 and is irradiated on the groove portion of the second discharge electrode 12.

Radiation of the EUV light from the electric discharge section 1 is performed as set forth below. The laser light is irradiated on the Sn or Li from the laser emitting device 23. The Sn or Li irradiated by laser light is evaporated between the first discharge electrode 11 and the second discharge electrode 12, and part thereof ionizes. In such circumstances, when pulsed electric power whose voltage is about +20 kV to −20 kV is impressed from the pulsed power supply 15 between the first discharge electrode 11 and the second discharge electrode 12, electric discharge occurs between the edge shape portions formed in the circumference sections of the first discharge electrode 11 and the second discharge electrode 12. At this time, pulse-like large current flows into the portion in which part of the Sn or Li evaporated between the first discharge electrode 11 and the second discharge electrode 12 ionizes, and the high temperature plasma caused by the evaporated Sn or Li is formed in the circumference section between the electrodes, and EUV light with a wavelength of 13.5 nm is emitted from the high temperature plasma.

The EUV light generated in the electric discharge section 1 is emitted towards an optical system (not shown) provided in the exposure unit side from the EUV light extraction section 7 through the collector unit 2 arranged in the second chamber l0b, as mentioned above. A gas curtain nozzle 4 connected to a gas supply unit 16a which supplies mixed gas containing at least one of hydrogen, hydrogen and helium, argon, krypton, and nitrogen is arranged in an area between the electric discharge section 1 and the collector unit 2, in which the gas from the first gas supply unit 16a is supplied so that the gas may flow into the debris by the gas curtain nozzle 4, and is exhausted by the first gas exhaust unit 9a. Furthermore, a foil trap 3 is arranged in an area between the gas curtain nozzle 4 and the collector unit 2. Moreover, as mentioned above, for example, the second gas supply unit 16b and the second gas exhaust unit 9b are arranged at the light emitting side of the collector unit 2, so that the gas flow is formed from the light emitting side of the light collector unit 2 to the light incidence side thereof, and part of gas supplied from the second gas supply unit 16b is exhausted from the second gas exhaust unit 9b, and the remaining gas is exhausted from the first gas exhaust unit 9a through the inner side of the collector unit 2. In such a structure, all the gas that flows toward the light incidence side of the collector unit 2 from the light emitting side can pass inside the collector unit 2, so that it is possible to prevent the debris from adhering so as to be deposited or being deposited on the reflective surface of the collector unit 2.

In addition, as mentioned above, it is also possible to supply cleaning gas from the second gas supply unit 16b in this embodiment. Moreover, as shown in the second embodiment, the foil trap 3 and the collector unit 2 are integrally formed so that the gas introduced from the light emitting side of the collector unit 2 may pass only inside the foil trap 3, so that it is possible to prevent debris from adhering/being deposited on the foil trap 3. Furthermore, as shown in FIGS. 7 to 10, the gas introducing ports (gas nozzles) of the gas supply unit 16b may be provided in the light emitting side of the collector unit 2.

The preceding description has been presented only to illustrate and describe exemplary embodiments of the extreme ultraviolet radiation source device according to the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. An extreme ultraviolet radiation source device comprising:
   a vessel;
   an electric discharge section including a pair of main discharge electrodes;
   a material supply unit which supplies an extreme ultraviolet radiation species to the electric discharge section;
   a high voltage generating section which impresses high voltage to the pair of main discharge electrodes;
   a grazing incidence type collector mirror which has a through hole, and condenses extreme ultraviolet light emitted from the electric discharge section through the through hole;
   a light extraction section formed in the vessel;
   a gas supply unit which supplies gas into the vessel from a light emitting side of the collector mirror;
   an exhaust unit which exhausts the gas from a light incidence side of the collector mirror,
   wherein the gas supplied from the light emitting side of the collector mirror passes through only-the through hole of the collector mirror and the gas passes through the through hole simultaneously as the grazing incidence type collector mirror condenses extreme ultraviolet light.

2. The extreme ultraviolet radiation source device according to claim 1, further including a foil trap provided between the electric discharge section and the collector mirror, which prevents debris exhausted from the electric discharge section from moving to the collector mirror, whereby the gas passing inside the collector mirror passes only the foil trap so as to be exhausted from the exhaust unit.

3. The extreme ultraviolet radiation source device according to claim 1, wherein the gas is cleaning gas having effect of removing the debris or the gas is mixed gas containing cleaning gas.

4. The extreme ultraviolet radiation source device according to claim 2, wherein the gas is cleaning gas having effect of removing the debris or the gas is mixed gas containing cleaning gas.

5. The extreme ultraviolet radiation source device according to claim 1, wherein the collector mirror is provided on an inner wall which projects toward the inside of the vessel so that the gas does not substantially flow outside the collector mirror.

6. The extreme ultraviolet radiation source device according to claim 1, further including a collector mirror support which surrounds and supports the collector mirror, wherein the support serves as a partition so that the gas does not substantially flow outside of the collector mirror.

7. The extreme ultraviolet radiation source device according to claim 2, further including a support member which surrounds the collector mirror, wherein the support member serves as a partition so that the gas does not substantially flow outside of the collector mirror, and wherein the support member supports the collector mirror and the foil trap.

8. The extreme ultraviolet radiation source device according to claim 1, wherein the gas supply unit comprises two or more gas nozzles.

9. The extreme ultraviolet radiation source device according to claim 8, wherein the two or more gas nozzles are provided so as to surround an opening of the collector mirror.

10. The extreme ultraviolet radiation source device according to claim 9, wherein the two or more gas nozzles are provided at equal intervals.

11. The extreme ultraviolet radiation source device according to claim 1, wherein the gas supply unit comprises a gas pipe having nozzles which are disposed on a collector mirror support.

12. The extreme ultraviolet radiation source device according to claim 11, wherein the nozzles are provided on one side of the gas pipe.

13. The extreme ultraviolet radiation source device according to claim 11, wherein the nozzles are provided on both sides of the gas pipe.

14. The extreme ultraviolet radiation source device according to claim 1, wherein the pair of discharge electrodes is rotating electrodes.

15. The extreme ultraviolet radiation source device according to claim 1, wherein the extreme ultraviolet radiating species is tin.

16. An extreme ultraviolet radiation source device comprising:

a casing;

a pair of main discharge electrodes;

a collector mirror provided in the casing and having a through hole, for condensing light emitted through the through hole by discharge caused by the pair of discharge electrode, toward a light extraction section formed in the casing, wherein the collector mirror divides an inner space of the casing into a first space and a second space, the first space is connected to the second space only through the through hole of the collector mirror, and the first space is located in a light emitting side of the collector mirror in the inner space of the casing, the second space is located in a light incidence side of the collector mirror in the inner space of the casing, and a light extraction section is formed in the casing in a side of the first space;

a gas supply unit connected to the first space of the casing, which supplies gas into the first space; and an exhaust unit connected to the second space of the casing, which exhausts the gas from the second space, wherein the gas which is supplied from the gas supply unit into the first space, passes through only the though hole of the collector mirror so as to flow into the second space.

* * * * *